United States Patent [19]

Persson

[11] Patent Number: 4,878,025
[45] Date of Patent: Oct. 31, 1989

[54] TROUBLE FINDER FOR TESTING AN ELECTRICAL SYSTEM OF A VEHICLE FOR SHORT-CIRCUITING

[76] Inventor: Peter Persson, Tallvägen 75, S-902 Umeå, Sweden

[21] Appl. No.: 235,883
[22] PCT Filed: Feb. 9, 1987
[86] PCT No.: PCT/SE87/00059
§ 371 Date: Aug. 11, 1988
§ 102(e) Date: Aug. 11, 1988
[87] PCT Pub. No.: WO87/04797
PCT Pub. Date: Aug. 13, 1987

[30] Foreign Application Priority Data

Feb. 11, 1986 [SE] Sweden ............................. 8600595

[51] Int. Cl.4 .......................................... G01R 31/02
[52] U.S. Cl. ..................................... 324/503; 324/500
[58] Field of Search ............... 324/500, 503, 504, 539, 324/542, 512, 523

[56] References Cited

U.S. PATENT DOCUMENTS 4,187,504  2/1980  Cantrell ............................... 324/539
4,243,934  1/1981  Brasfield ............................. 524/503

Primary Examiner—Reinhard J. Eisenzopf
Assistant Examiner—Anthony L. Miele
Attorney, Agent, or Firm—Cushman, Darby & Cushman

[57] ABSTRACT

A device for tracing preferably short-circuiting in electric systems.

When tracing short-circuiting it is desirable that voltage and current will have normal values immediately after elimination thereof, for instance by contact. This object has been achieved in that an oscillator (23) limits the current at the output (19) to near 0 A as long as short-circuiting remains.

When the short-circuiting ceases this is detected by a unit of sensitivity (24) and, as a result of this, the oscillation stops and preset current and voltage levels are entered immediately and automatically.

12 Claims, 2 Drawing Sheets

TROUBLE FINDER FOR TESTING AN ELECTRICAL SYSTEM OF A VEHICLE FOR SHORT-CIRCUITING

BACKGROUND OF THE INVENTION

This invention relates to a trouble finder for testing an electrical system, especially the type which may be found in vehicles.

Most vehicles of today, such as trucks, private cars etc. have complex electric systems, for instance for the lighting of different devices. Anyone who has some time being in contact with troubleshooting in faulty electric systems has quickly realized the extent of the problem.

Typical errors which are difficult to find include short-circuiting in the wiring systems. Short-circuiting appears typically in the form of damage caused by squeezing and abrasion.

The new trouble finder is preferably to be used for tracing errors in electric systems of vehicles such as trucks and towed vehicles. A special problem of towed vehicles is that they require an external power supply for operation and control.

The use of an external power supply suggests that the towed vehicle should either be connected to a driving vehicle or that some sort of external current source must be used, e.g. batteries or transformers. Moreover, heavy trailers of trucks require great space which often makes connections of a trailer and driving vehicle impossible.

Today's workshops have solved the problem by utilizing in the first place heavy batteries usually transported on a cart or the like. It is then possible to connect the voltage required by the system by means of temporary cables. In a workshop hall, hoses and cables are usually lying on the floor which involves an awkward handling if the batteries are transported by carts. Troubleshooting with batteries also increases the risk of overheating, and consequently burns on occur cables since fuses are not used.

An alternative method of troubleshooting includes the use of transformers adapted to the required voltage level. Short-circuiting is then detected as blown fuses in the equipment. Transformers deliver alternate current and therefore cannot be used when tracing errors for instance in electric magnets, direct current motors, relays etc, which require continuous voltage. Several fuses are required in the troubleshooting as the repairer must proceed by trial and error and turn on voltage each time when a short-circuit is found not to be eliminated. Furthermore, the repairer must move in the course of the work between the equipment and the place where troubleshooting is being performed each time a fuse has blown. Finally, the repairer will not get any indication where the error is. With a trailing length that may amount to 18 m it is realized that a large part of the work is required for moving about and that the working time is prolonged.

SUMMARY OF THE INVENTION

The present product is intended to eliminate these problems in location of faults and to add three further functions that may come in handy during the work with electric systems. These three functions include a built-in current limit relay test, a precision voltmeter and a function for locating ground connection.

The new trouble finder has none of the above shortcomings occurring in connection with known techniques. The trouble finder of the present invention comprises a transformer; a rectifier coupled to an output of the transformer; an oscillator powered by the rectifier; a regulator powered by the rectifier; means for connecting an output of the oscillator to an input of the regulator; first and second output terminals for connection to the system under test; an ammeter connecting the voltage regulator to the first output terminal; a voltmeter connecting the first and second output terminals; a protection unit coupled to the regulator; a sensitivity unit, coupled to the first and second output terminals, arranged to sense voltage across the output terminals; a potentiometer coupled to the sensitivity unit; and an oscillator unit for limiting the output current of the regulator unit when the electric system short circuits.

According to the present invention repairer connects the trailer contact to the equipment after adjustment in order to control thereafter the respective function. It will be possible to detect short-circuiting, if any, through a needle throw. After this a current limiting function begins to operate which is initiated by the repairer after indication. This function limits the current for example to about 0.5 A and will give give minimum power losses. Troubleshooting can then in principle continue during this time as long as desired with connected short-circuiting. When the short-circuiting is eliminated, for instance in that the repairer touches a wire, the trouble finder will stop limiting the current immediately and automatically. The trouble finder will then provide a sufficient current and voltage level so that the required power can be achieved in the function to be controlled. In this way the repairer will directly have an indication that the place of short-circuiting has been located through for instance lamps immediately starting to light. If the repairer cannot view the function to be controlled, he can choose a function acoustically providing an indication that the current limitation has stopped. As long as short circuiting/troubleshooting the short circuit is continuing a diode on the trouble finder is lit to indicate the short circuit.

The invention is described below more in detail with reference to the enclosed drawings.

DETAILED DESCRIPTION OF THE PREFERRED EMBODIMENT

Figure 1:
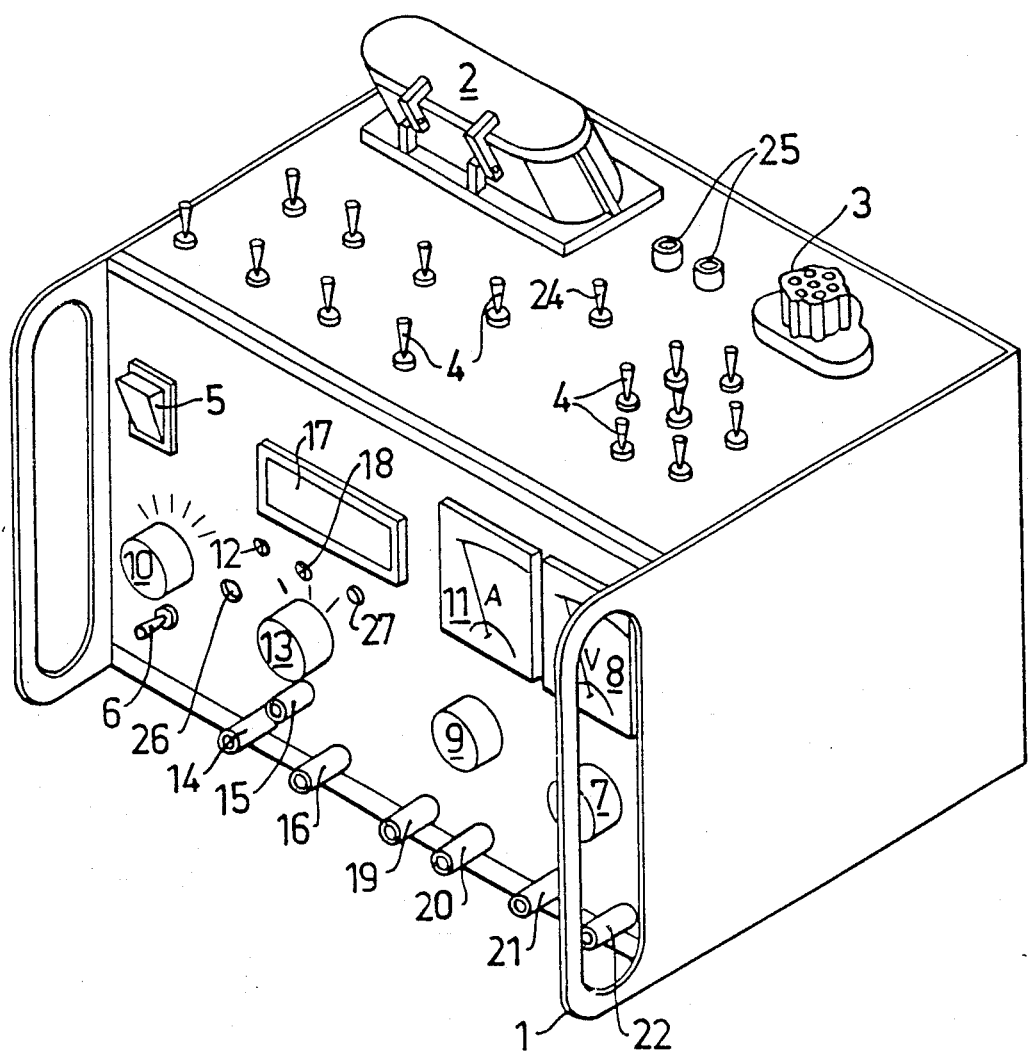
FIG. 1 shows the embodiment of the new trouble finder.

The trouble finder has been provided with two handles 1 to be easily carried and moved and for protection of buttons and pointer instruments. On the upper side thereof two sockets 2, 3 are mounted which are intended for the most frequent electric contacts. In other cases adapters are used.

It is intended that the repairer should connect the trailer contact to the trouble finder afer preparing the equipment for troubleshooting. Before troubleshooting can be started the following preparations must be made.

(a) Line voltage is turned on by means of the switch 5.

(b) The desired function of the equipment is adjusted by means of the switch 6. In this case, when short-circuiting is to be traced troubleshooting/short-circuiting is set.

(c) The sensitivity potentiometer 10 is turned to minimum position.

(d) The potentiometer 9 for current limitation is turned to maximum position.

(e) Adjustment of the required voltage level, mostly 6, 12 or 24 V, is to be made by means of the rotary potentiometer 7. The voltage level is indicated by means of the pointer instrument 8.

The repairer can then connect the trailer contact to the socket 2 or 3 with or without an adapter, depending on the embodiment.

On the upper side of the trouble finder that is also a plurality of small switches 4 to be used by the repairer to check the respective function in a given order, for instance stop or rear lights of the object to be controlled. When the respective function is satisfactory nothing else will happen but that lamps will light up and the ammeter 11 will change its deflection depending on the load being checked at that moment. When short-circuiting is found the major part of the resistance will disappear and, as a result of this, the current will rise towards maximum simultaneously as the voltage decreases towards zero. This is indicated by a needle throw on the pointer instruments 8, 11. The repairer should now turn the sensitivity potentiometer 10 from the preset minimum value successively towards increased deflection exactly to the position when the ammeter 11 reduces its deflection by a jump to about 0.5 A and the light emitting diode 27 for indication of short-circuiting/troubleshooting is lit. The sensitivity potentiometer 10 should be adjusted as fast as possible so that the current level is reduced, for during the time the current level is maximal the effect is converted into heat that must be removed by cooling.

Cooling at maximum effect can only be carried out for a limited period of time. If this period is exceeded an automatic overheating protection starts to operate and the equipment will be unusable for a short time interval. Overheating is indicated by the aid of a light emitting diode 12. Now the work with locating the fault can be started. Due to the low current level the current can be turned on despite of the fact that short-circuiting is present and troubleshooting can in principle continue for any desired time. When short-circuiting ceases, for instance through the repairer touching cables or the like, the trouble finder will immediately and automatically deliver enough current for the relative function in order to indicate directly when short-circuiting comes to an end. Indication appears in that the previously erroneous function is lit again, and if needed, a summer activated by the switch 24 is also put in operation. By this the repairer has located the error without it being necessary to move between the current supply unit and the object.

Figure 2:
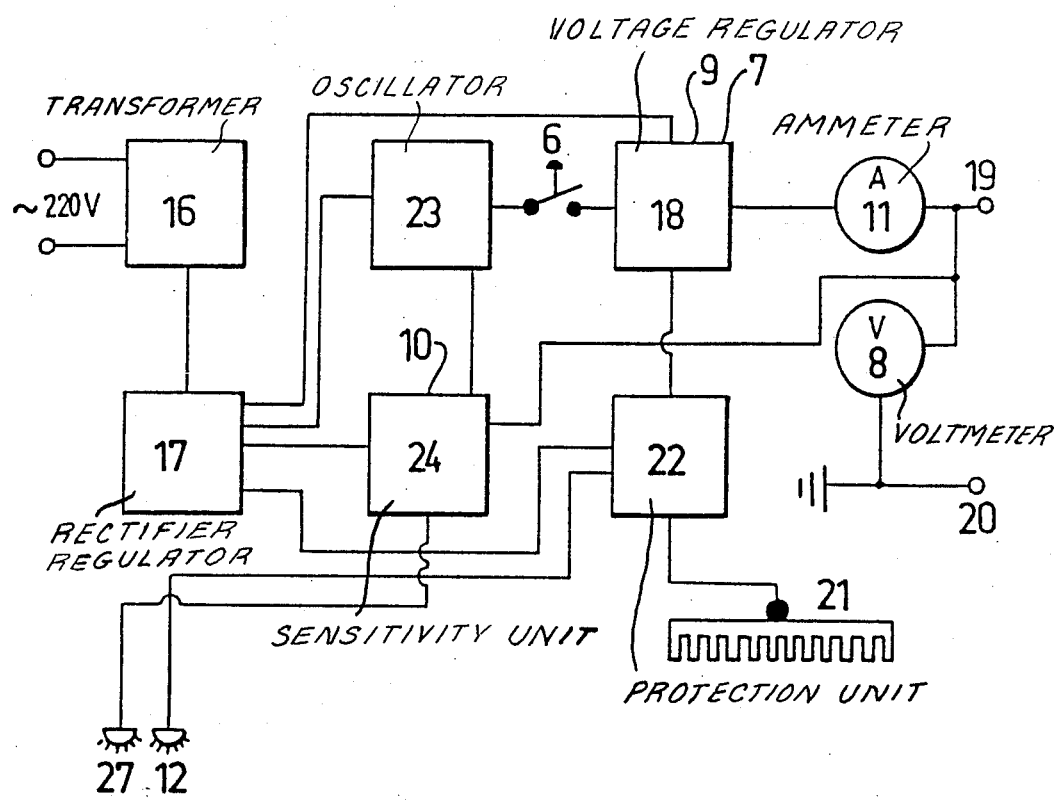
FIG. 2 shows a block diagram of the function of the trouble finder.

FIG. 2 is a block diagram which how the unit operates. A toroid core transformer 16 converts the voltage from 220 V –40 V A C. The transformer delivers 10 A. The voltage is converted into direct current and is adjusted to different voltage levels in the rectifier and regulator 17 for feeding of the different units. Output voltage and current can be varied by means of variable voltage regulator 18 using the potentiometers 7 and 9 to desired values (2–37 V, 200 mA–10 A). The ammeter 11 and the volt meter 8 indicate the set levels. Current is taken out via the sockets 19 and 20. The voltage regulator 18 with current limitation is working independently as voltage unit in this position. If the sockets 19 and 20 are short-circuited the set current level will appear in the form of power losses which are cooled away by cooling fins. If this state is allowed to continue the cooling fins will be rapidly overheated and a temperature sensitive resistance 21 will activate the protection 22 against overheating. At the same time as the protection 22 against overheating is activated the light emitting diode 12 for indication will light up.

In order to avoid effects of losses in short-circuitning and to enable a quick readjustment of current/voltage via the voltage regulator 18 when short-circuiting is eliminated an oscillator 23 and a sensitivity unit 24 have been connected according to FIG. 2. It is the object of the sensitivity unit 24 to sense the output 19 in order to find out if there is short-circuiting or not. If short-circuiting is found the voltage will drop. Depending on wire length to short-circuiting a voltage will arise on the output 19 which voltage deviates from 0 V. It is desired to eliminate this deviation. The deviation can be removed by adjusting a potentiometer 10 via an operational amplifier. The oscillator 23 will then sense the output 19 with a voltage level of 0 V and thereby an oscillation of a certain adjustable frequency starts.

At each positive pulse of oscillator 23, the voltage regulator 18 is cut out and O V is detected on the output 19. When the output of oscillator 23 zero volts, the voltage regulator 18 is connected. If there is short circuiting the voltage will not exceed the voltage level to which the wire resistance that has been removed by adjustment of the sensitivity unit 24 corresponds. The oscillator 23 will still sense the output 19 with the voltage level 0 V and will then continue to oscillate. A current will be detected by the ammeter 11 but due to the short time interval during which voltage/current is connected the current will not have the necessary time to rise to more than 0.5 A. Owing to this short-circuiting may remain in principle any time as the power losses have been eliminated to a large extent. If short-circuiting is removed the voltage will rise above the level to which the wire resistance removed by adjustment corresponds. The oscillator 23 will then sense the voltage level of the output to be greater than 0 V and it will thereby stop to oscillate. The voltage regulator 18 will then immediately deliver the set voltage/current level. By this an indication of the position of the short-circuiting will be obtained without different shifting of places to exchange fuses or to turn on voltage between voltage source and object.

Since oscillator 23 varies the connection of voltage regulator 18, switch 6 may be provided to permit enabling or disabling of the troubleshooting for short-circuiting; when switch 6 is open, voltage regulator 18 is no longer responsive to oscillator 23, and hence the current limiting function of the apparatus is disabled.

While this invention has been described in connection with what is presently considered to be the most practical and preferred embodiment, it is to be understood that the invention is not limited to the disclosed embodiment, but, on the contrary, is intended to cover various modifications and equivalent arrangements included within the spirit and scope of the appended claims.

I claim:

1. A trouble finder for testing an electrical system, comprising:

a transformer having an input adapted to be coupled to a power source;

a rectifier, coupled to an output of said transformer;

an oscillator unit coupled so as to receive power from said rectifier;

a regulator coupled to said rectifier so as to receive power therefrom;

means for coupling an output of said oscillator to an input of said regulator;

first and second output terminals for connection to said electrical system to be tested;

an ammeter coupling said voltage regulator to said first output terminal;

a voltmeter coupling said first and second output terminals;

a protection unit coupled to said regulator;

a sensitivity unit, connected to said first and second output terminals and arranged to enable sensing of a voltage across said output terminals, the output voltage deviating from zero upon connection of said trouble finder to an electrical system being tested;

a potentiometer, coupled to said sensitivity unit, for balancing the sensed voltage to zero level; and wherein said oscillator unit is intended for limiting the output current of the regulator unit at an occurrence of a short-circuit in the electrical system, said oscillator unit being activated by a balanced 0-zero voltage level detected by the sensitivity unit.

2. A trouble finder according to claim 1, wherein said means for coupling an output of said oscillator to said regulator comprises a manually operable switch coupled between said oscillator and said regulator.

3. A trouble finder according to claim 2 wherein further comprising means, coupled to said protection unit for protecting against overheating, said protecting means being activated by a resistance sensitive to temperature.

4. A trouble finder according to claim 3 further comprising a first light-emitting diode connected to said sensitivity unit so as to be activated when a voltage deviating from 0 appears across said first and second output terminals.

5. A trouble finder according to claim 4 further comprising a second light-emitting diode connected said protection unit for indicating an overheating condition.

6. A trouble finder according to claim 3 further comprising a second light-emitting diode connected said protection unit for indicating an overheating condition.

7. A trouble finder according to claim 2 further comprising a first light-emitting diode connected to said sensitivity unit so as to be activated when a voltage deviating from 0 appears across said first and second output terminals.

8. A trouble finder according to claim 7 further comprising a second light-emitting diode connected said protection unit for indicating an overheating condition.

9. A trouble finder according to claim 2 further comprising a second light-emitting diode connecting said protection unit for indicating an overheating condition.

10. A trouble finder according to claim 1 further comprising a first light-emitting diode connected to said sensitivity unit so as to be activated when a voltage deviating from 0 appears across said first and second output terminals.

11. A trouble finder according to claim 10 further comprising a second light-emitting diode connected said protection unit for indicating an overheating condition.

12. A trouble finder according to claim 1 further comprising a second light-emitting diode connected said protection unit for indicating an overheating condition.

* * * * *